US011515180B2

(12) United States Patent
Takebayashi et al.

(10) Patent No.: US 11,515,180 B2
(45) Date of Patent: Nov. 29, 2022

(54) WAFER-HEATING DEVICE

(71) Applicant: NGK INSULATORS, LTD., Nagoya (JP)

(72) Inventors: Hiroshi Takebayashi, Handa (JP); Kengo Torii, Handa (JP); Natsuki Hirata, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 175 days.

(21) Appl. No.: 16/552,019

(22) Filed: Aug. 27, 2019

(65) Prior Publication Data

US 2019/0385871 A1 Dec. 19, 2019

Related U.S. Application Data

(63) Continuation of application No. PCT/JP2018/007532, filed on Feb. 28, 2018.

(60) Provisional application No. 62/465,982, filed on Mar. 2, 2017.

(51) Int. Cl.
*H05B 3/68* (2006.01)
*H01L 21/67* (2006.01)
*H05B 3/14* (2006.01)

(52) U.S. Cl.
CPC ....... *H01L 21/67103* (2013.01); *H05B 3/143* (2013.01); *H05B 3/68* (2013.01)

(58) Field of Classification Search
CPC .............. H01L 21/02; H01L 21/67103; H01L 21/67109; H05B 3/143; H05B 3/283; H05B 3/68
USPC .... 219/443.1–468.2, 541–548; 338/306–314
See application file for complete search history.

(56) References Cited

U.S. PATENT DOCUMENTS

| | | | | |
|---|---|---|---|---|
| 4,100,395 A | * | 7/1978 | Ballard | H01C 3/12 392/434 |
| 5,488,349 A | * | 1/1996 | Erickson | H01C 10/32 338/128 |
| 6,133,557 A | | 10/2000 | Kawanabe et al. | |
| 6,737,612 B2 | * | 5/2004 | Taniguchi | H05B 3/141 219/541 |
| 7,279,661 B2 | | 10/2007 | Okajima et al. | |
| 2004/0188413 A1 | * | 9/2004 | Natsuhara | H05B 3/143 219/444.1 |
| 2007/0188413 A1 | * | 8/2007 | Furukawa | G09G 3/296 345/67 |

(Continued)

FOREIGN PATENT DOCUMENTS

| | | |
|---|---|---|
| CN | 103325714 A | 9/2013 |
| JP | H08-274147 A1 | 10/1996 |

(Continued)

OTHER PUBLICATIONS

International Search Report and Written Opinion (Application No. PCT/JP2018/007532) dated May 29, 2018.

(Continued)

*Primary Examiner* — Sang Y Paik
(74) *Attorney, Agent, or Firm* — Burr & Brown, PLLC

(57) ABSTRACT

In a ceramic heater, a central-zone heating resistor and an outer-peripheral-zone heating resistor are embedded in a disc-like ceramic base having a wafer-mounting surface on one side. The central-zone heating resistor is a wire extending in a single continuous line from one of a pair of terminals to the other. The pair of terminals as a whole form a circular shape in plan view.

9 Claims, 9 Drawing Sheets

(56) References Cited

U.S. PATENT DOCUMENTS

| | | | |
|---|---|---|---|
| 2010/0243635 A1 | 9/2010 | Nakamura et al. | |
| 2013/0248509 A1 | 9/2013 | Unno et al. | |
| 2019/0088517 A1* | 3/2019 | Kosakai | ............ H01L 21/67248 |

FOREIGN PATENT DOCUMENTS

| | | |
|---|---|---|
| JP | H11-074064 A1 | 3/1999 |
| JP | H11-220008 A1 | 8/1999 |
| JP | 2002-025913 A1 | 1/2002 |
| JP | 2004-099313 A | 4/2004 |
| JP | 2004-349666 A1 | 12/2004 |
| JP | 3897563 B2 | 3/2007 |
| JP | 2010-257956 A1 | 11/2010 |
| JP | 2014-099313 A1 | 5/2014 |
| JP | 2016-062999 A1 | 4/2016 |
| JP | 2017-010884 A1 | 1/2017 |
| JP | 2017-152137 A1 | 8/2017 |
| TW | 200504794 A | 2/2005 |
| WO | 2015/132563 A1 | 9/2015 |
| WO | 2016/080502 A1 | 5/2016 |

OTHER PUBLICATIONS

Japanese Office Action (with English translation), Japanese Application No. 2019-503066, dated Jul. 6, 2021 (14 pages).
Taiwanese Office Action, Taiwanese Application No. 11020565660, dated Jun. 16, 2021 (12 pages).

* cited by examiner

Heating Resistor in Central Zone

Heating Resistor in Outer Peripheral Zone

WAFER-HEATING DEVICE

BACKGROUND OF THE INVENTION

1. Field of the Invention

The present invention relates to a wafer-heating device.

2. Description of the Related Art

Semiconductor-manufacturing apparatuses employ wafer-heating devices for heating wafers. As such a wafer-heating device, a device is known in which a heating resistor is embedded in a base having a surface serving as a wafer-mounting surface. A heating resistor includes a pair of terminals that are wired in a single continuous line from one of the terminals to the other. For example, in a device disclosed by PTL 1 illustrated in FIG. 14, a ceramic base is divided into a central zone and an outer peripheral zone, and a heating resistor is provided in each of the central zone and the outer peripheral zone.

CITATION LIST

Patent Literature

PTL 1: JP 2017-152137 A

SUMMARY OF THE INVENTION

In such a wafer-heating device, in plan view as illustrated in FIG. 15, a pair of terminals 311 and 312 of a heating resistor 310 appear as two circles positioned at an interval from each other. Therefore, the heating resistor 310 needs to be irregularly laid out to go around the two circular terminals 311 and 312. In such a case, the area of an irregularly laid-out part is large. Moreover, since the heating resistor 310 is not present between the two circular terminals 311 and 312, it is difficult to increase the temperature uniformity of the wafer.

The present invention is to solve the above problems, and a main object of the present invention is to make the temperature uniformity of a wafer higher than in the prior art.

A first wafer-heating device according to the present invention is a wafer-heating device in which a heating resistor is embedded in a base having a wafer-mounting surface on one side, wherein the heating resistor is a wire extending in a single continuous line from one of a pair of terminals to the other, and wherein the pair of terminals as a whole form a circular shape in plan view.

In the wafer-heating device, the pair of terminals of the heating resistor as a whole form a circular shape in plan view. Therefore, the pattern of the heating resistor is designed in such a manner as to go around only one circle. Accordingly, the area of an irregularly laid-out part of the heating resistor is small. Furthermore, the area between the pair of terminals, where no heating resistor is present, can be made small. Accordingly, the influence of the area with no heating resistor upon the temperature uniformity of the wafer is small. Hence, the temperature uniformity of the wafer can be made higher than in the prior art.

The material of "the base" may be ceramic, resin, or the like.

In the first wafer-heating device according to the present invention, in plan view, the one of the pair of terminals may appear as one of semicircular parts obtained by halving a predetermined circle, and the other of the pair of terminals may appear as the other of the semicircular parts obtained by halving the predetermined circle. Alternatively, in plan view, the one of the pair of terminals may appear as a circular part obtained by dividing a predetermined circle into the circular part at a center and an annular part on an outer side of the circular part, and the other of the pair of terminals may appear as a C-shaped part extending along the annular part. In such a configuration, the plan-view shape of the pair of terminals as a whole can be easily made circular.

In the first wafer-heating device according to the present invention, the base may be provided with a pair of lands on a surface opposite the wafer-mounting surface, the pair of lands being shaped in correspondence with the pair of terminals, respectively. In such a case, a cooling plate having a refrigerant passage inside may be joined to the surface of the base that is opposite the wafer-mounting surface, and the cooling plate may have one through-hole provided at a position not interfering with the refrigerant passage and in such a manner as to face the pair of lands. The through-hole may be a cause for the occurrence of temperature singularity in the wafer. In this case, the cooling plate has only one through-hole for the pair of terminals of the heating resistor. Hence, the number of temperature singularities is smaller and the temperature uniformity of the wafer can therefore be increased more easily than in a case where a through-hole is provided for each of the terminals.

In the first wafer-heating device according to the present invention, the base may be divided into a plurality of zones, and the heating resistor may be provided for each of the zones. In such a configuration, temperature can be controlled for each of the zones.

A second wafer-heating device according to the present invention is a wafer-heating device in which at least two heating resistors are embedded in a base having a wafer-mounting surface on one side, wherein the heating resistors are each a wire extending in a single continuous line from one of a pair of terminals to the other, and wherein a total of four terminals of the two heating resistors are collectively provided at one position such that the four terminals as a whole form a circular shape in plan view.

In the wafer-heating device, the total of four terminals of the two heating resistors are collectively provided at one position such that the four terminals as a whole form a circular shape in plan view. Therefore, the pattern of each of the heating resistors is designed in such a manner as to go around only one circle. Accordingly, the area of an irregularly laid-out part of the heating resistor is small. Furthermore, the area between the four terminals, where no heating resistor is present, can be made small. Accordingly, the influence of the area with no heating resistor upon the temperature uniformity of the wafer is small. Hence, the temperature uniformity of the wafer can be made higher than in the prior art.

In the second wafer-heating device according to the present invention, in plan view, the four terminals may appear as four respective sectorial parts obtained by dividing a predetermined circle with two diametrical lines that are orthogonal to each other. In such a configuration, the plan-view shape of the four terminals as a whole can be easily made circular.

In the second wafer-heating device according to the present invention, the base may be provided with four lands on a surface opposite the wafer-mounting surface, the four lands being shaped in correspondence with the four terminals, respectively. In such a case, a cooling plate having a refrigerant passage inside may be joined to the surface of the base that is opposite the wafer-mounting surface, and the cooling plate may have one through-hole provided at a position not interfering with the refrigerant passage and in such a manner as to face the four lands. The through-hole may be a cause for the occurrence of temperature singularity in the wafer. In this case, the cooling plate has only one through-hole for the four terminals of the heating resistors. Hence, the number of temperature singularities is smaller and the temperature uniformity of the wafer can therefore be increased more easily than in a case where one through-hole is provided for each of the four terminals.

DETAILED DESCRIPTION OF THE INVENTION

Figure 1:
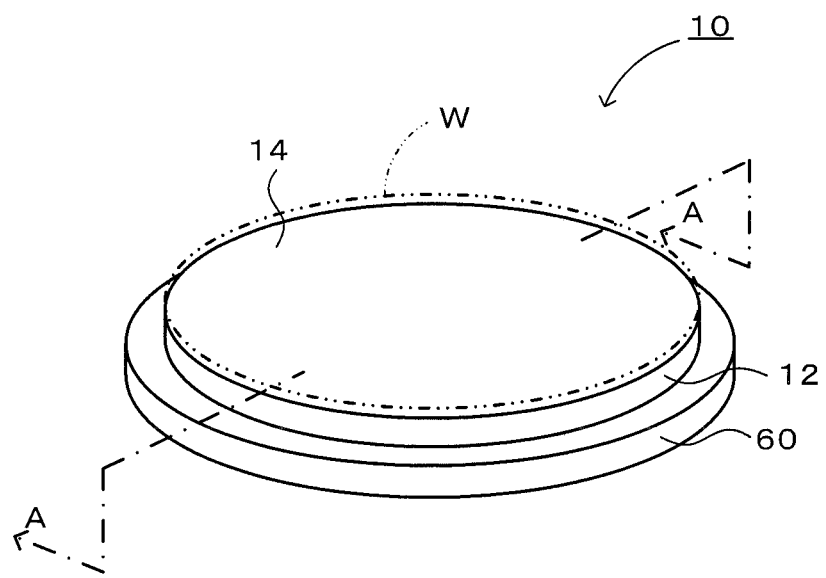
FIG. 1 is a perspective view of a ceramic heater 10.
Figure 2:
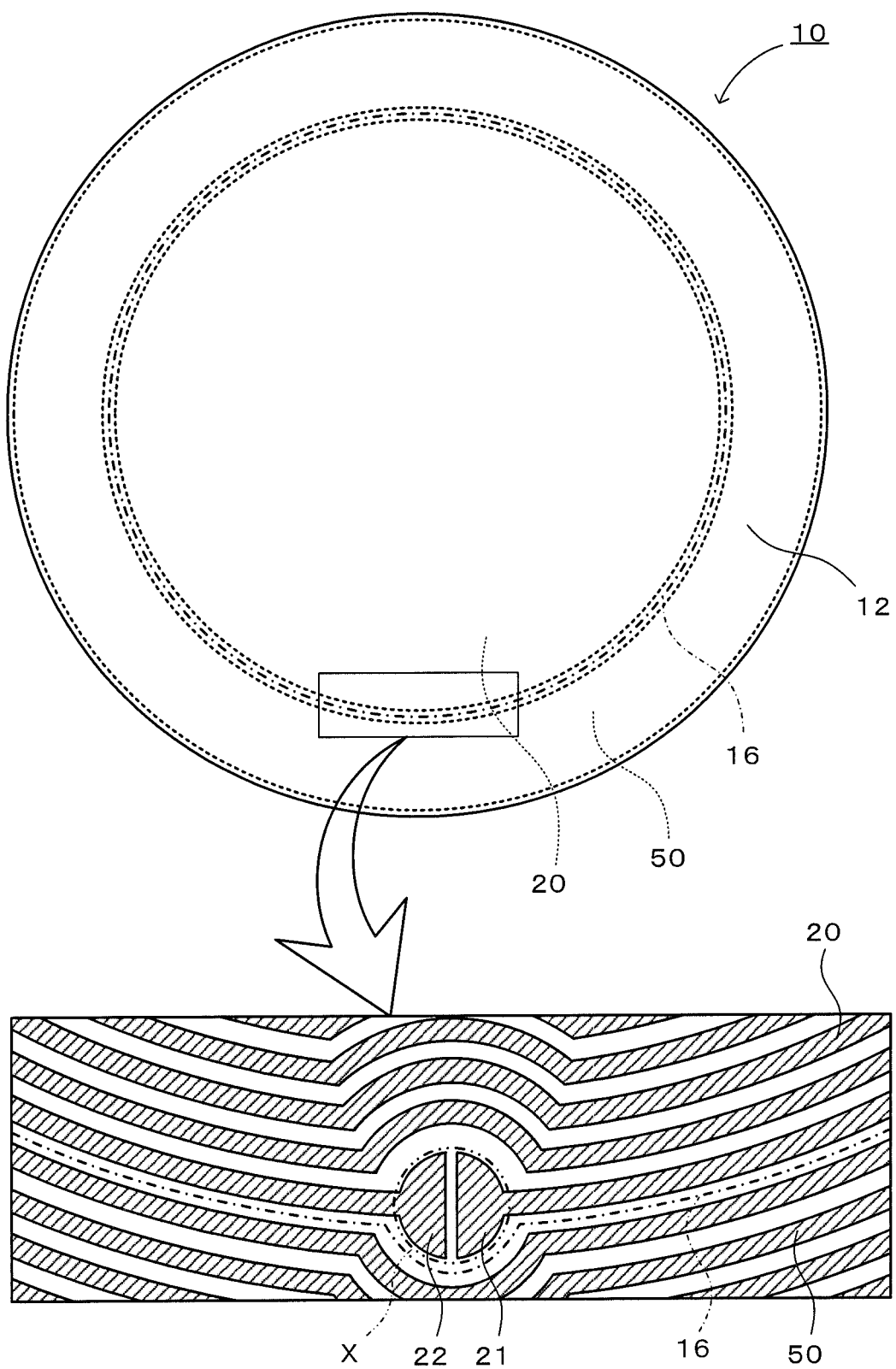
FIG. 2 is a plan view of the ceramic heater 10 (with a horizontal sectional view around a pair of terminals 21 and 22).
Figure 3:
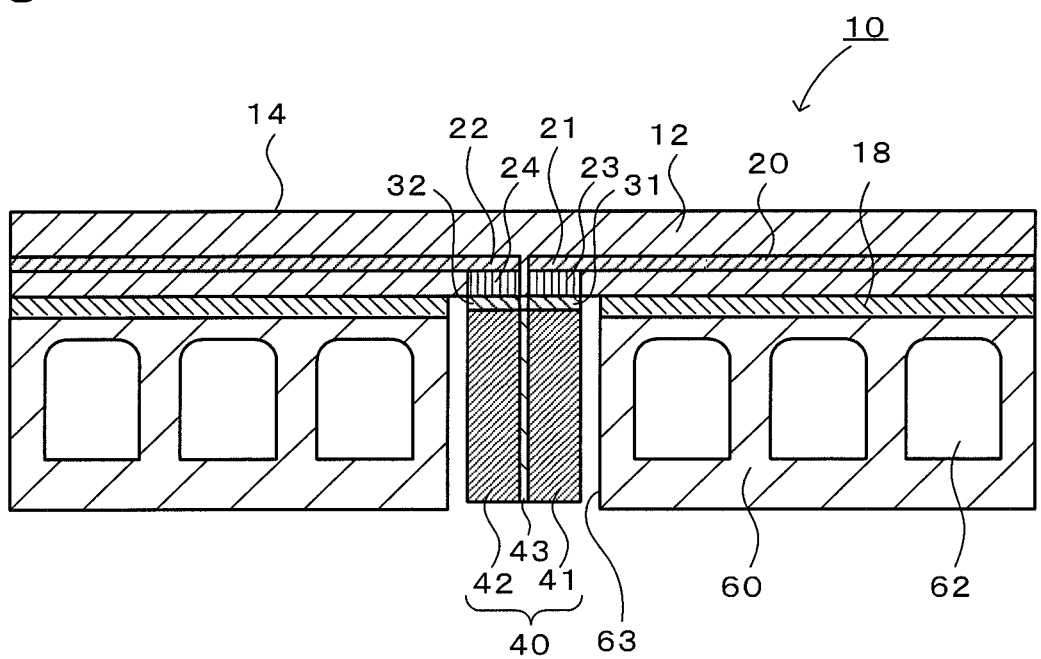
FIG. 3 is a sectional view of part of FIG. 1 taken along line A-A.
Figure 4:
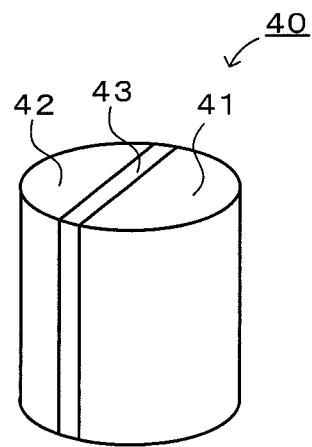
FIG. 4 is a perspective view of a connecting member 40.
Figure 5:
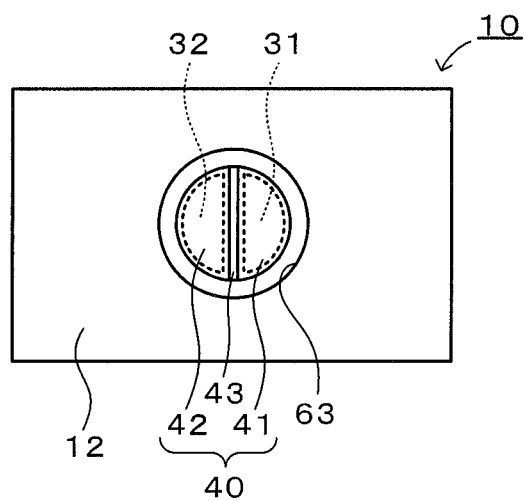
FIG. 5 is a bottom view of the ceramic heater 10 around a through-hole 63.
Figure 6:
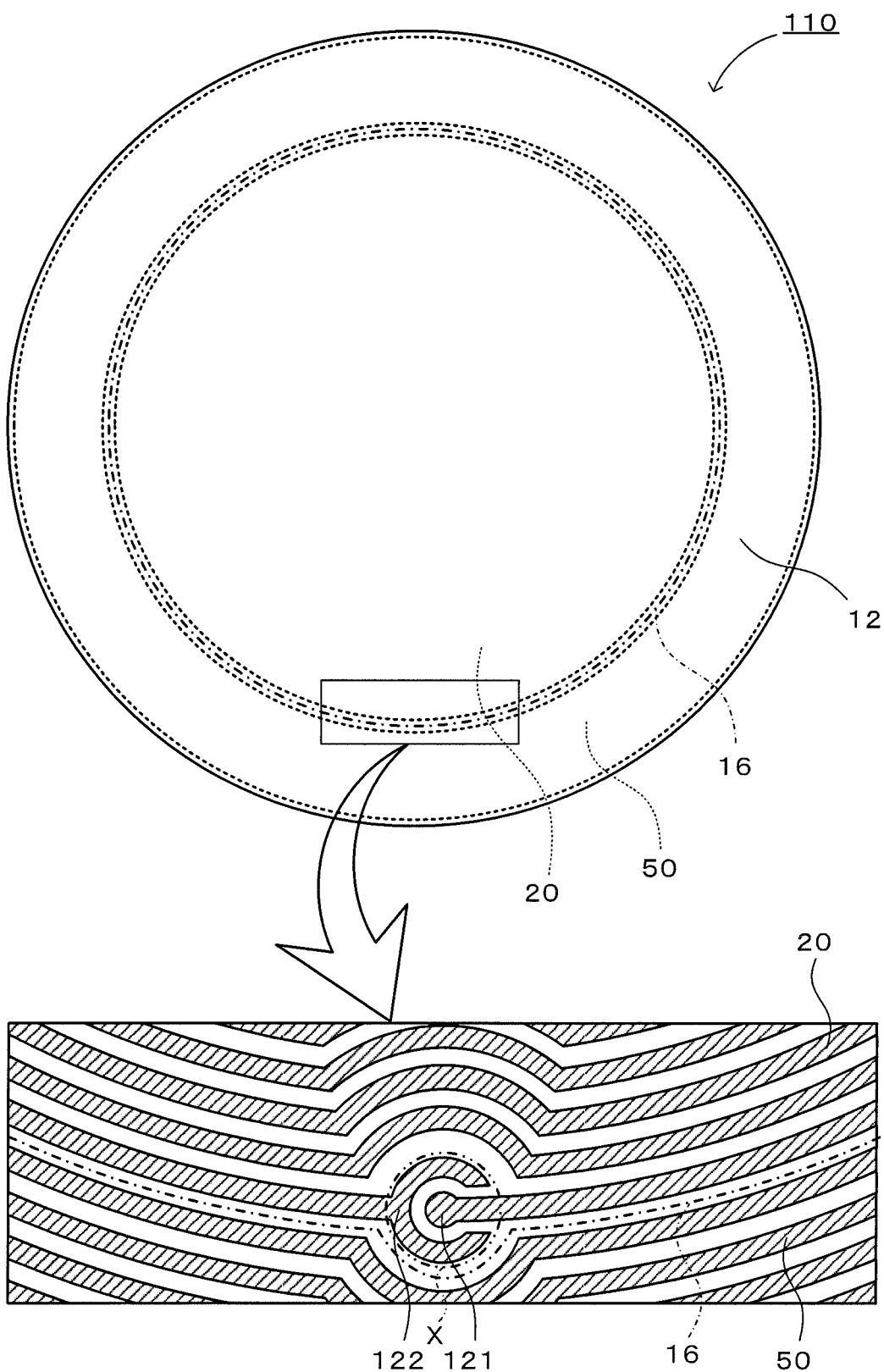
FIG. 6 is a plan view of a ceramic heater 110 (with a horizontal sectional view around a pair of terminals 121 and 122).

An embodiment of the present invention will now be described with reference to the drawings. FIG. 1 is a perspective view of a ceramic heater 10 according to the present embodiment. FIG. 2 is a plan view of the ceramic heater 10 (with a horizontal sectional view around a pair of terminals 21 and 22). FIG. 3 is a sectional view of part of FIG. 1 taken along line A-A. FIG. 4 is a perspective view of a connecting member 40. FIG. 5 is a bottom view of the ceramic heater 10 around a through-hole 63.

The ceramic heater 10 includes a ceramic base 12, a central-zone heating resistor 20 (see FIG. 2), an outer-peripheral-zone heating resistor 50 (see FIG. 2), and a cooling plate 60.

The ceramic base 12 is a disc-like plate made of a ceramic material represented by aluminum nitride, silicon carbide, silicon nitride, aluminum oxide, or the like. The ceramic base 12 has a thickness of, for example, 0.5 mm to 30 mm. A surface of the ceramic base 12 serves as a wafer-mounting surface 14 on which a wafer W is to be mounted. The wafer-mounting surface 14 may have a plurality of projections and depressions formed by embossing or a plurality of grooves. The ceramic base 12 includes a central zone and an outer peripheral zone. The central zone is a circular area on the inner side with respect to a virtual boundary 16 (see FIG. 2) forming a circle that is concentric with the ceramic base 12. The outer peripheral zone is an annular area on the outer side with respect to the virtual boundary 16.

Figure 14:
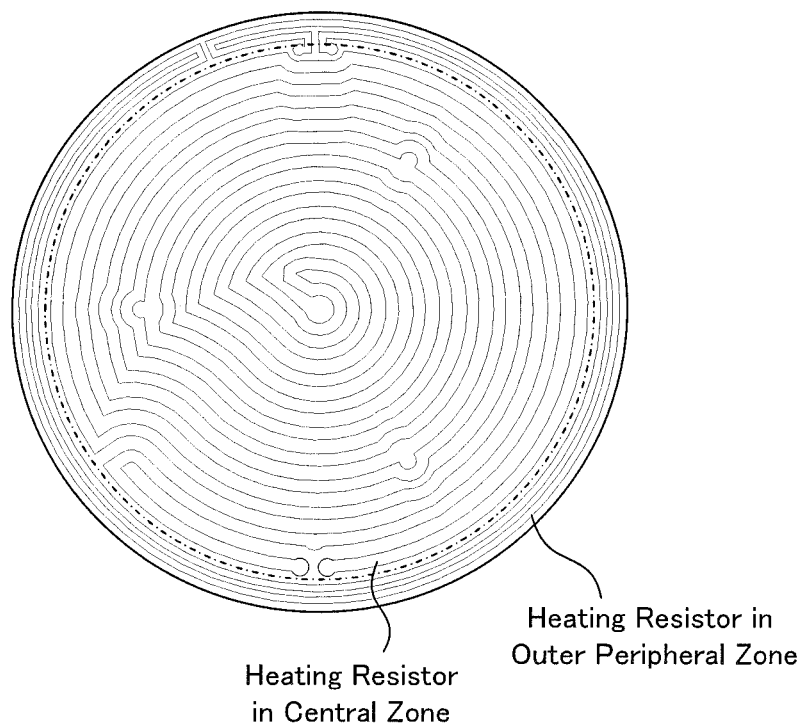
FIG. 14 is a plan view of a prior-art wafer-heating device.

The central-zone heating resistor 20 is embedded in the central zone of the ceramic base 12. As illustrated in FIG. 2, the central-zone heating resistor 20 is a coil of wire running over the entirety of the central zone and in a single continuous line from the terminal 21, which is one of the pair of terminals 21 and 22, to the other terminal 22. The wiring pattern of the central-zone heating resistor 20 is not specifically limited to but may be, for example, the wiring pattern of the heating resistor in the central zone illustrated in FIG. 14. The material of the coil may be, for example, Cu, Al, SUS, Fe, W, Ti, or the like. The pair of terminals 21 and 22 as a whole form a predetermined circle X (the circle illustrated by a two-dot chain line in FIG. 2) in plan view. In the present embodiment, in the plan view of the pair of terminals 21 and 22, the terminal 21 appears as one of two semicircular parts obtained by halving the circle X, and the terminal 22 appears as the other of the semicircular parts obtained by halving the circle X. As illustrated in FIG. 3, the back surface (a surface opposite the wafer-mounting surface 14) of the ceramic base 12 is provided with a pair of lands 31 and 32. As illustrated in FIG. 5, the pair of lands 31 and 32 have semicircular disc-like shapes in correspondence with the pair of terminals 21 and 22, respectively. As illustrated in FIG. 3, the terminal 21 and the land 31 are connected to each other through a conductive member 23 embedded in the ceramic base 12. The terminal 22 and the land 32 are also connected to each other through a similar conductive member 24. A gap between the land 31 and the land 32 may be filled with an insulator.

The lands 31 and 32 are connected to a power source, not illustrated, for the central-zone heating resistor 20 through the connecting member 40. The connecting member 40 has a round-columnar shape. As illustrated in FIG. 4, the connecting member 40 includes a columnar first member 41 having a semicircular bottom face, and a columnar second member 42 also having a semicircular bottom face. The first member 41 and the second member 42 are combined such that rectangular faces thereof face each other with an insulator 43 interposed therebetween, thereby forming a round columnar shape as a whole. The first member 41 and the second member 42 are each bonded to the insulator 43 with heat-resisting adhesive such as epoxy resin. The first and second members 41 and 42 may be made of, for example, copper. The insulator 43 may be made of, for example, ceramic. At least a surface of the connecting member 40 that comes into contact with the lands 31 and 32 is ground such that the first and second members 41 and 42 and the insulator 43 are flush with one another. The first member 41 is connected to one of the poles of the power source, not illustrated. The second member 42 is connected to the other pole of the power source.

The outer-peripheral-zone heating resistor 50 is embedded in the outer peripheral zone of the ceramic base 12. The outer-peripheral-zone heating resistor 50 is a coil of wire running over the entirety of the outer peripheral zone and in a single continuous line from one of a pair of terminals, not illustrated, to the other. The wiring pattern of the outer-peripheral-zone heating resistor 50 is not specifically limited to but may be, for example, the wiring pattern of the heating resistor in the outer peripheral zone illustrated in FIG. 14. The pair of terminals of the outer-peripheral-zone heating resistor 50 have the same shapes and are laid out in the same way as the pair of terminals 21 and 22 of the central-zone heating resistor 20, and are connected to a power source for the outer-peripheral-zone heating resistor 50 through lands similar to the pair of lands 31 and 32, and a connecting member similar to the connecting member 40.

As illustrated in FIG. 3, the cooling plate 60 is joined to the back surface of the ceramic base 12 with a bonding sheet 18 interposed therebetween. The cooling plate 60 is a disc made of metal (such as Al or an Al alloy) and has thereinside a refrigerant passage 62 through which refrigerant (such as water) is allowed to flow. The refrigerant passage 62 runs such that the refrigerant flows through the entirety of the ceramic base 12. The refrigerant passage 62 has a supply port and a discharge port (both not illustrated) for the refrigerant. The cooling plate 60 has one through-hole 63 provided at a position not interfering with the refrigerant passage 62. The through-hole 63 faces the pair of lands 31 and 32 of the central-zone heating resistor 20. The through-hole 63 has a diameter that is slightly greater than the diameter of the circle X and the diameter of the connecting member 40. The inner wall of the through-hole 63 is preferably coated with an insulating film. The connecting member 40 is positioned in the through-hole 63. As with the through-hole 63, another through-hole, not illustrated, is provided in the cooling plate 60 at a position not interfering with the refrigerant passage 62 and in such a manner as to face the pair of lands of the outer-peripheral-zone heating resistor 50.

The above ceramic heater 10 can be manufactured in accordance with a manufacturing method disclosed by, for example, Japanese Patent No. 3897563. Therefore, the method of manufacturing the ceramic heater 10 is not described herein.

Now, an exemplary usage of the ceramic heater 10 will be described. Herein, a step of forming a semiconductor thin film on a wafer by performing plasma CVD with the ceramic heater 10 will be described. The ceramic heater 10 is placed in a tightly sealed chamber of a semiconductor-manufacturing apparatus, not illustrated. The chamber has a gas supply port through which a source gas such as silane gas is supplied thereinto, a vacuum port through which the gas in the chamber is discharged therefrom, and so forth.

In plasma CVD, a target temperature is set first, and the temperature of the ceramic base 12 is controlled by using a controller, not illustrated. The controller receives temperatures of the central zone and the outer peripheral zone of the ceramic base 12 from a thermocouple, not illustrated, and adjusts the power to be supplied to the central-zone heating resistor 20 and the outer-peripheral-zone heating resistor 50 such that the temperatures of the central zone and the outer peripheral zone reach respective target temperatures. Thus, the controller controls the temperature of the ceramic base 12. Furthermore, the chamber is vacuumed, and the source gas is supplied into the chamber. Then, after the temperatures of the central zone and the outer peripheral zone of the ceramic base 12 become substantially the same as the respective target temperatures, a wafer is mounted on the wafer-mounting surface 14 of the ceramic base 12 while the temperature of the ceramic base 12 is kept controlled. Immediately after the wafer is mounted, the temperature of the wafer itself is lower than the target temperatures. Therefore, the temperatures measured are lowered by several degrees. However, since the temperatures are controlled by the controller, the temperatures are raised to the target temperatures again. In this state, plasma is generated, whereby a semiconductor thin film is formed on the wafer from the source gas.

Here, the correspondence between relevant elements of the present embodiment and relevant elements of the present invention will be clarified. The ceramic heater 10 according to the present embodiment corresponds to the first wafer-heating device according to the present invention. The ceramic base 12 corresponds to the base. The central-zone heating resistor 20 and the outer-peripheral-zone heating resistor 50 each correspond to the heating resistor.

Figure 15:
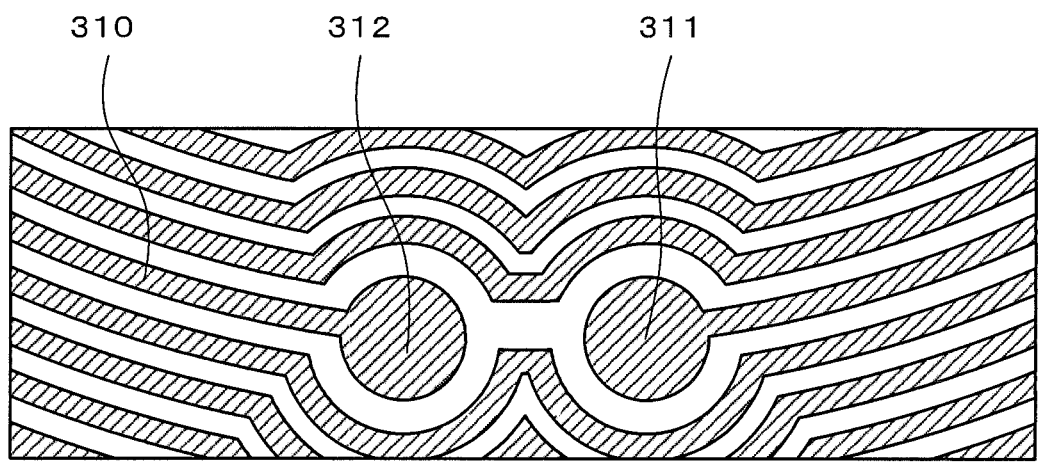
FIG. 15 is a horizontal sectional view around two circular terminals 311 and 312.

In the ceramic heater 10 described above, the pair of terminals 21 and 22 of the central-zone heating resistor 20 as a whole form a shape of the circle X in plan view. Therefore, as illustrated in FIG. 2, the pattern of the central-zone heating resistor 20 is designed in such a manner as to go around only the one circle X. Accordingly, the area of an irregularly laid-out part of the heating resistor is smaller than in the case illustrated in FIG. 15 in which the heating resistor needs to go around two circles. Furthermore, the area between the pair of terminals 21 and 22, where no heating resistor is present, can be made smaller than in the case illustrated in FIG. 15. Accordingly, the influence of the area with no heating resistor upon the temperature uniformity of the wafer W is smaller. The pair of terminals, not illustrated, of the outer-peripheral-zone heating resistor 50 are configured and laid out in the same way as the pair of terminals 21 and 22 of the central-zone heating resistor 20, and therefore produce the same advantageous effects as above. Accordingly, the temperature uniformity of the wafer W can be made higher than in the prior art.

In the ceramic heater 10, the pair of lands 31 and 32 shaped in correspondence with the pair of terminals 21 and 22 are provided on the back surface of the ceramic base 12. Furthermore, the cooling plate 60 has one through-hole 63 provided at a position not interfering with the refrigerant passage 62 and in such a manner as to face the pair of lands 31 and 32. The through-hole 63 may be a cause for the occurrence of temperature singularity in the wafer W. In the present embodiment, the cooling plate 60 has one through-hole 63 for the pair of terminals 21 and 22 of the central-zone heating resistor 20. This also applies to the outer-peripheral-zone heating resistor 50. That is, the cooling plate 60 further has one through-hole for the pair of terminals of the outer-peripheral-zone heating resistor 50. Therefore, the temperature uniformity of the wafer W can be increased more easily than in a case where a through-hole is provided for each of the terminals.

Furthermore, the ceramic base 12 is divided into a plurality (two) of zones. The central-zone heating resistor 20 is provided in the central zone. The outer-peripheral-zone heating resistor 50 is provided in the outer peripheral zone. Therefore, temperature can be adjusted for each of the zones.

Needless to say, the present invention is not limited to the above embodiment in any way and may be embodied in various ways within the technical scope thereof.

Figure 7:
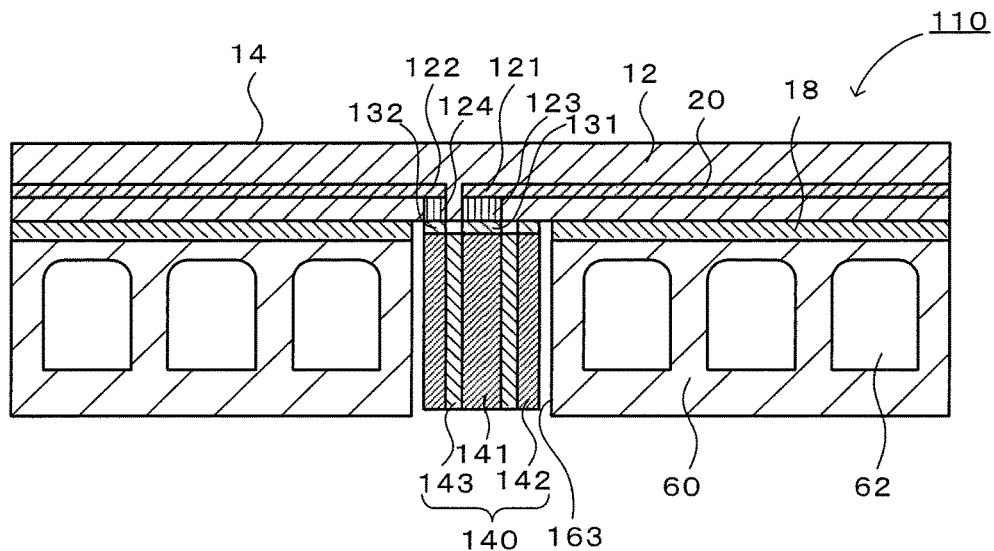
FIG. 7 is a sectional view of part of the ceramic heater 110.
Figure 8:
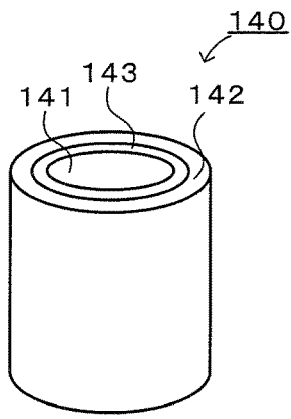
FIG. 8 is a perspective view of a connecting member 140.
Figure 9:
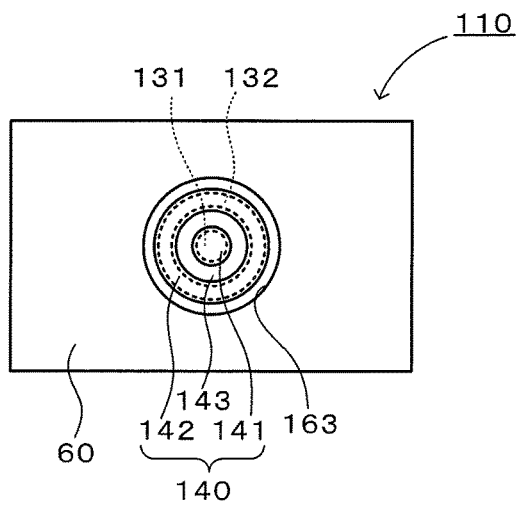
FIG. 9 is a bottom view of the ceramic heater 110 around a through-hole 163.

For example, while the pair of terminals 21 and 22 of the central-zone heating resistor 20 according to the above embodiment each appear as a semicircular part in plan view, the terminals 21 and 22 may each have any shape, as long as the terminals 21 and 22 as a whole appear as a circular shape. For example, as in the case of a ceramic heater 110 illustrated in FIG. 6, the predetermined circle X may be divided into a circular part at the center and an annular (ring) part on the outer side of the circular part such that one terminal 121 appears as the circular part while another terminal 122 appears as a C-shaped part extending along the annular part. In such a case, as illustrated in FIGS. 7 and 9, a land 131 provided on the back surface of the ceramic base 12 has a circular shape corresponding to the shape of the one terminal 121, and a land 132 has an annular shape corresponding to the shape of the other terminal 122. The land 132 may have a C shape, as with the terminal 122. Furthermore, as illustrated in FIG. 8, a connecting member 140 includes a round columnar member 141 having a circular bottom face corresponding to the land 131, and a hollow cylindrical member 142 having an annular bottom face corresponding to the land 132, with an insulating cylinder 143 interposed therebetween and bonded thereto, thereby forming a round columnar shape as a whole. The cooling plate 60 has one through-hole 163 for the pair of terminals 121 and 122. The connecting member 140 is positioned in the through-hole 163. The outer-peripheral-zone heating resistor 50 also has a pair of terminals that are configured and laid out in the same way as the pair of terminals 121 and 122. In FIGS. 6 to 9, elements that are the same as those described in the above embodiment are denoted by corresponding ones of the reference numerals. In such a configuration as well, the same advantageous effects as those produced by the above embodiment can be obtained.

Figure 10:
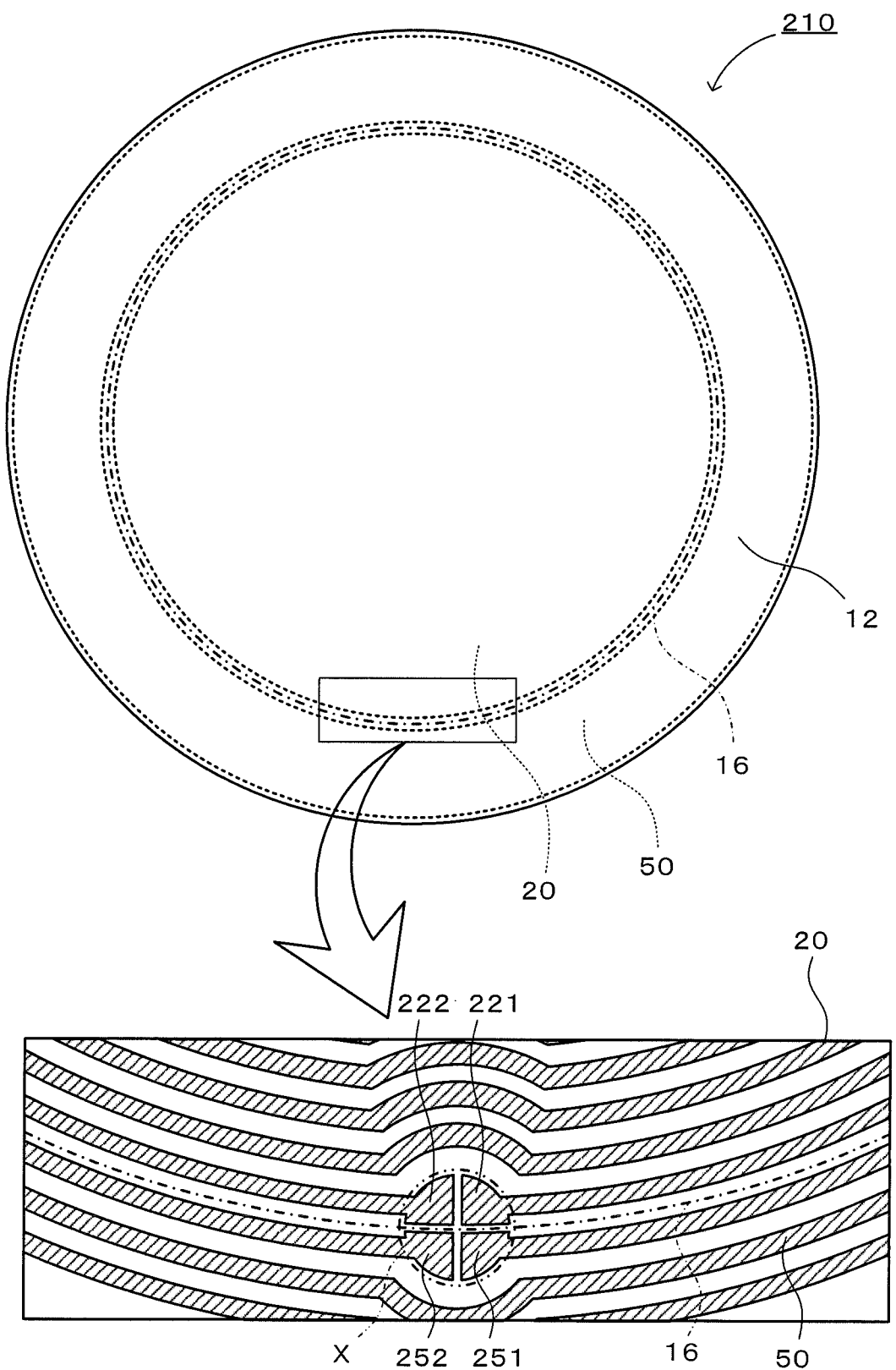
FIG. 10 is a plan view of a ceramic heater 210 (with a horizontal sectional view around terminals 221, 222, 251, and 252).
Figure 11:
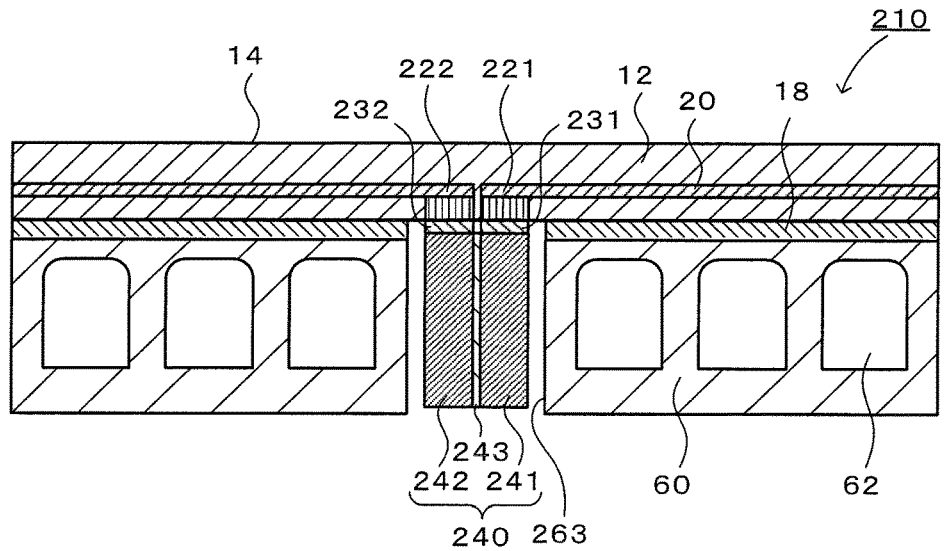
FIG. 11 is a sectional view of part of the ceramic heater 210.
Figure 12:
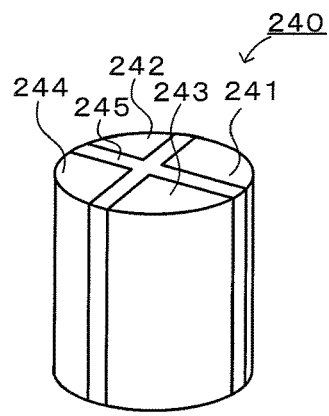
FIG. 12 is a perspective view of a connecting member 240.
Figure 13:
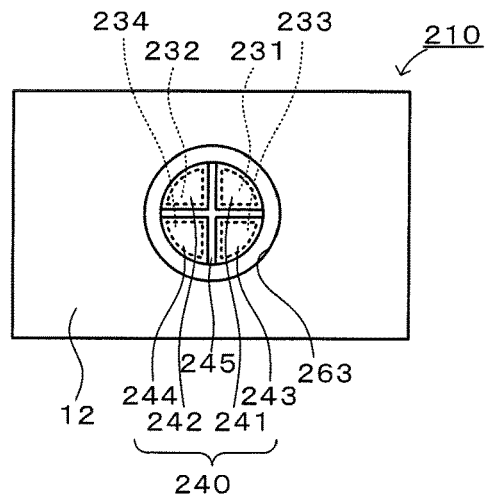
FIG. 13 is a bottom view of the ceramic heater 210 around a through-hole 263.

Alternatively, as in a ceramic heater 210 illustrated in FIG. 10, a pair of terminals 221 and 222 of the central-zone heating resistor 20 and a pair of terminals 251 and 252 of the outer-peripheral-zone heating resistor 50 may be collectively provided at one position such that the four terminals 221, 222, 251, and 252 as a whole form a predetermined circle X in plan view. In FIG. 10, the four terminals 221, 222, 251, and 252 appear as, in plan view, four respective sectorial parts obtained by dividing the predetermined circle X with two diametrical lines that are orthogonal to each other. In such a case, as illustrated in FIGS. 11 and 13, four lands 231 to 234 are provided on the back surface of the ceramic base 12. The lands 231 to 234 have sectorial shapes corresponding to the terminals 221, 222, 251, and 252, respectively, and are connected to the respective terminals 221, 222, 251, and 252 through respective conductive members embedded in the ceramic base 12. Furthermore, as illustrated in FIG. 12, a connecting member 240 includes metal columnar members 241 to 244 having sectorial bottom faces corresponding to the respective lands 231 to 234, and an insulator 245 interposed between and bonded to the columnar members 241 to 244, thereby forming a round columnar shape as a whole. The cooling plate 60 has one through-hole 263 for the four lands 231 to 234. The connecting member 240 is positioned in the through-hole 263. The lands 231 and 232 of the central-zone heating resistor 20 are connected to the power source, not illustrated, for the central-zone heating resistor 20 through the columnar members 241 and 242 of the connecting member 240. The lands 233 and 234 of the outer-peripheral-zone heating resistor 50 are connected to the power source, not illustrated, for the outer-peripheral-zone heating resistor 50 through the columnar members 243 and 244 of the connecting member 240. In FIGS. 10 to 13, elements that are the same as those described in the above embodiment are denoted by corresponding ones of the reference numerals. The ceramic heater 210 is an example of the second wafer-heating device according to the present invention and produces the same advantageous effects as those produced by the above embodiment. In particular, since the four terminals in this case as a whole form a circular shape, the area of an irregularly laid-out part of the heating resistors is further reduced. In addition, the number of through-holes 263 to be provided in the cooling plate 60 is further reduced.

In the above embodiment, the ceramic heater 10 includes the heating resistors 20 and 50 that are embedded in the ceramic base 12. Alternatively, the ceramic base 12 may be replaced with a disc-like heat-resisting resin sheet (such as a sheet made of polyimide resin or liquid-crystal polymer). In such a case, the connecting member 40 may be joined to the lands 31 and 32 by first providing solder cream on the lands 31 and 32 by printing, then setting the connecting member 40 such that the first member 41 faces the land 31 and the second member 42 faces the land 32, and lastly soldering them by reflowing. The solder is repelled by the resin sheet and selectively gathers on the lands 31 and 32. Therefore, the probability that a bridge may be formed between the lands 31 and 32 is low. This also applies to the ceramic heaters 110 and 210.

In the above embodiment, the ceramic base 12 includes the central-zone heating resistor 20 and the outer-peripheral-zone heating resistor 50. Alternatively, the ceramic base 12 may include only one heating resistor. Moreover, the ceramic base 12 may be divided into three or more zones, and a heating resistor may be provided in each of the zones. If the ceramic base 12 is divided into three or more zones, the zones may include a circular central zone and a plurality of annular zones having different diameters and provided concentrically on the outer side of the central zone, or a plurality of sectorial zones. It is only necessary that the pair of terminals of each heating resistor are configured and laid out in the same way as the pair of terminals 21 and 22 according to the above embodiment (or the pair of terminals 121 and 122).

In the above embodiment, the central-zone heating resistor 20 and the outer-peripheral-zone heating resistor 50 are each a coil but are not limited thereto. The central-zone heating resistor 20 and the outer-peripheral-zone heating resistor 50 may each be, for example, a mesh (a net) or a flat plate.

In the above embodiment, the ceramic base 12 may further include thereinside electrostatic electrodes for electrostatic chucking or high-frequency electrodes for plasma generation.

The present application claims priority from U.S. Patent Application No. 62/465,982 filed on Mar. 2, 2017, the entire contents of which are incorporated herein by reference.

What is claimed is:
1. A wafer-heating device comprising a heating resistor which is embedded in a base having a wafer-mounting surface on one side,
wherein the heating resistor is a wire extending in a single continuous line from one of a pair of terminals to the other,
wherein the pair of terminals as a whole form a circular shape in plan view and are connected to one connecting member,
the connecting member has two columnar members each of which corresponds to each of the pair of terminals,
the two columnar members are combined with a ceramic insulator interposed therebetween, thereby as a whole forming a circular shape in plan view, wherein the base is provided with a pair of lands on a surface opposite the wafer-mounting surface, the pair of lands being shaped in correspondence with the pair of terminals, respectively.

2. The wafer-heating device according to claim 1,
wherein, in plan view, the one of the pair of terminals appears as one of semicircular parts obtained by halving a predetermined circle, and the other of the pair of terminals appears as the other of the semicircular parts obtained by halving the predetermined circle.

3. The wafer-heating device according to claim 1,
wherein, in plan view, the one of the pair of terminals appears as a circular part obtained by dividing a predetermined circle into the circular part at a center and an annular part on an outer side of the circular part, and the other of the pair of terminals appears as a C-shaped part extending along the annular part.

4. The wafer-heating device according to claim 1,
wherein a cooling plate having a refrigerant passage inside is joined to the surface of the base that is opposite the wafer-mounting surface, and
wherein the cooling plate has one through-hole provided at a position not interfering with the refrigerant passage and in such a manner as to face the pair of lands.

5. The wafer-heating device according to claim 1,
wherein the base is divided into a plurality of zones, and
wherein the heating resistor is provided for each of the zones.

6. A wafer-heating device comprising at least two heating resistors which are embedded in a base having a wafer-mounting surface on one side,
wherein the heating resistors are each a wire extending in a single continuous line from one of a pair of terminals to the other, and
wherein a total of four terminals of the two heating resistors are collectively provided at one position such that the four terminals as a whole form a circular shape in plan view and are connected to one connecting member,
the connecting member has four columnar members each of which corresponds to each of the four terminals,
the four columnar members are combined with a ceramic insulator interposed therebetween, thereby as a whole forming a circular shape in plan view.

7. The wafer-heating device according to claim 6,
wherein, in plan view, the four terminals appear as four respective sectorial parts obtained by dividing a predetermined circle with two diametrical lines that are orthogonal to each other.

8. The wafer-heating device according to claim 6,
wherein the base is provided with four lands on a surface opposite the wafer-mounting surface, the four lands being shaped in correspondence with the four terminals, respectively.

9. The wafer-heating device according to claim 8,
wherein a cooling plate having a refrigerant passage inside is joined to the surface of the base that is opposite the wafer-mounting surface, and
wherein the cooling plate has one through-hole provided at a position not interfering with the refrigerant passage and in such a manner as to face the four lands.

* * * * *